United States Patent
Gao et al.

(10) Patent No.: US 8,374,566 B2
(45) Date of Patent: Feb. 12, 2013

(54) INTEGRATED WIDEBAND RF TRACKING FILTER FOR RF FRONT END WITH PARALLEL BAND SWITCHED TUNED AMPLIFIERS

(75) Inventors: Weinan Gao, San Diego, CA (US); Ray Rosik, San Diego, CA (US)

(73) Assignee: NXP B.V., Einhoven (NL)

( * ) Notice: Subject to any disclaimer, the term of this patent is extended or adjusted under 35 U.S.C. 154(b) by 733 days.

(21) Appl. No.: 12/098,122

(22) Filed: Apr. 4, 2008

(65) Prior Publication Data

US 2009/0251618 A1    Oct. 8, 2009

(51) Int. Cl.
*H04B 1/18* (2006.01)

(52) U.S. Cl. .......... 455/293; 455/168.1; 455/169.1; 455/178.1; 455/180.1; 455/188.1; 455/191.2; 455/280; 455/339; 455/340; 455/341; 333/129; 333/132; 333/175; 333/176; 333/177

(58) Field of Classification Search ........ 455/168.1, 455/169.1, 169.2, 178.1, 179.1, 180.1–180.4, 455/188.1, 188.2, 189.1, 190.1, 191.2, 280, 455/282, 284, 290, 266, 339–340, 193.1–193.3, 455/166.1, 341, 293; 333/174, 177, 175, 333/176, 129, 132
See application file for complete search history.

(56) References Cited

U.S. PATENT DOCUMENTS

| | | | | |
|---|---|---|---|---|
| 3,596,183 A * | 7/1971 | Spies | | 455/180.4 |
| 3,940,697 A * | 2/1976 | Morgan | | 455/168.1 |
| 3,996,521 A * | 12/1976 | Owens | | 455/166.1 |
| 4,057,760 A * | 11/1977 | Koch | | 455/154.2 |
| 4,138,654 A * | 2/1979 | Luhowy | | 334/55 |
| 5,483,209 A * | 1/1996 | Takayama | | 333/174 |
| 5,752,179 A * | 5/1998 | Dobrovolny | | 455/266 |
| 6,232,848 B1 * | 5/2001 | Manku | | 333/24 R |
| 6,438,361 B1 | 8/2002 | Chong et al. | | |
| 6,453,157 B1 | 9/2002 | Roberts | | |
| 6,915,121 B2 | 7/2005 | Python et al. | | |
| 7,127,217 B2 * | 10/2006 | Tuttle et al. | | 455/87 |
| 7,336,939 B2 * | 2/2008 | Gomez | | 455/307 |
| 7,340,230 B2 * | 3/2008 | Khoini-Poorfard et al. | | 455/132 |
| 7,580,684 B2 * | 8/2009 | Cyr et al. | | 455/75 |
| 7,991,370 B2 * | 8/2011 | Kabashima et al. | | 455/188.1 |
| 2001/0027093 A1 | 10/2001 | Krug | | |
| 2004/0063415 A1 | 4/2004 | Python et al. | | |
| 2005/0024544 A1 | 2/2005 | Waight et al. | | |
| 2005/0057399 A1 * | 3/2005 | Kipnis et al. | | 343/700 MS |
| 2006/0154636 A1 * | 7/2006 | Shah et al. | | 455/290 |

FOREIGN PATENT DOCUMENTS

WO    2006127106 A    11/2006

OTHER PUBLICATIONS

Gee, W.A, Allen, P.E., CMOS Integrated LC RF Bandpass Filter with Transformer-Coupled Q-Enhancement and Optimized Linearity, IEEE International Symposium on Circuits and Systems 2007, May 2007, pp. 1445-1448.

Entesari, K., Rebeiz, G., A 12-18 GHz Three-Pole RF MEMS Tunable Filter, IEEE Transactions on Microwave Theory and Techniques, vol. 53. No. 8, Aug. 2005, pp. 2566-2571.

(Continued)

*Primary Examiner* — Junpeng Chen

(57) ABSTRACT

A wideband RF tracking filter having a set of parallel tuned resonator amplifier stages with a de-Q resistor for each subband is disclosed. The resonant amplifier contains programmable tuned LC tank impedance and an array of parallel voltage to current converters (V2I) for each subband. The de-Q resistor together with the array of V2I converters provides a flat gain over each subband and each of the other subbands covering different frequencies.

22 Claims, 10 Drawing Sheets

OTHER PUBLICATIONS

I. Gutiérrez, I., Meléndez, J., Hernández, E., Design and Characterization of Integrated Varactors for RF Applications, 2006, pp. 11-30 John Wiley & Sons, New York.

International Search Report and Written Opinion, PCT/IB2009/051426, Mar. 4, 2009.

* cited by examiner

INTEGRATED WIDEBAND RF TRACKING FILTER FOR RF FRONT END WITH PARALLEL BAND SWITCHED TUNED AMPLIFIERS

BACKGROUND OF THE INVENTION

1. Field of the Inventions

The present invention relates to radio frequency (RF) tuners and specifically to integrated RF tracking filters.

2. Background Information

Following the integration trend in silicon, broadband tuners have also been integrated onto a single silicon chip. Many new applications such as Digital Video Broadcast-Handheld (DVB-H), Universal Serial Bus (USB) TV tuners for the personal computer, and dual tuners for Digital Video Recorder (DVR) have placed a premium on reduction of power. For example, low power DVB-H tuners can enable TV tuners to be integrated into wireless applications. However, for a wireless application low power consumption is extremely desirable as it leads to longer battery life. Low power consumption is very desirable for applications such as USB TV tuners to fit within the power supply capabilities of the USB interface. Furthermore, lower power consumption means lower heat dissipation requirements which enable applications that have packaging heat dissipation constraints such as dual tuners in DVR applications for cable, satellite, and terrestrial TV.

The power consumption in silicon RF tuners can be attributed to many sources. First, it requires tuners to exhibit a high linearity to be able to deal with various standards. In particular, the third order intercept point (IP3) must be within specified values. Depending on the application, various standards govern the lower bound of the IP3 such as Advanced Television Systems Committee (ATSC), National Television System Committee (NTSC), Data-Over-Cable Service Interface Specification (DOCSIS), and Next Generation Digital Video Broadcasting over Satellite (DVB-S2). High linearity requirements are necessary as they allow the tuner to maintain performance in many different environments with strong adjacent channel interferers, which in some cases are many times stronger than the desired signal. Lots of current and many popular feedback techniques are typically required to keep the IP3 high enough to meet the requirements of these TV standards.

Another dominant source of power consumption in silicon RF tuners is the receiver architecture. Traditionally super-heterodyne receivers, have been used for terrestrial and cable television applications due to their immunity to interference from local oscillator (LO) harmonics, by converting the incoming RF signal into an intermediate frequency (IF) signal and then extracting the baseband (or information) signal from the downconverted IF signal. However, super-heterodyne receivers consume a great deal of power due to its two frequency conversion stage architecture.

A direct conversion receiver which converts an incoming RF signal directly to a baseband signal consumes less power than the super-heterodyne receiver due to the savings in having a single stage and due to the need for only one downconversion step. FIG. 1 shows a basic direct conversion receiver. For clarity, many typical components are excluded from the diagram. An RF signal is received through antenna 102. Often the signal is boosted by low-noise amplifier (LNA) 104. The signal is then downconverted using mixer 106 with a signal produced by LO 108. The result is baseband signal 110 which is then further processed.

However, due to the proximity in frequency of the local oscillator signal to the input signal frequency a direct conversion receiver in broad band tuner applications is susceptible to undesired adjacent and alternate channels at the frequency of LO harmonics. For example in an analog terrestrial television application, the broadband tuner accepts frequencies ranging from 50 MHz to 850 MHz. To illustrate this point, suppose the tuner is set to receive at the low end of this range at 50 MHz. The LO would also be set to 50 MHz, but harmonics such as the $3^{rd}$ and $5^{th}$ harmonics could also be introduced into the mixer at 150 MHz and 250 MHz. (Typically, differential signals are used so even harmonics cancel out leaving only the odd harmonics as a concern.) This would result an undesired effect that any signals at 150 MHz and 250 MHz are down-converted to a baseband signal as well as the desired signal at 50 MHz. While the local oscillator (LO) harmonics generally are weaker than the LO fundamental frequency, it is not uncommon that the unwanted signals at the $3^{rd}$ or $5^{th}$ LO harmonic frequencies are stronger than the desired RF signal. The net result is that the interference from the LO harmonics can be quite significant and can desensitize the receiver.

One approach to remedy this situation is to apply a band-pass filter around the desired frequency to the received signal. In order to maintain the desired sensitivity and selectivity for the receiver, the bandpass filter should have a high Q in order to attenuate the adjacent channels and to maintain a large dynamic range. The RF tracking filter should have a programmable center frequency to follow the desired channel frequency.

FIG. 2 shows a direct conversion receiver with an RF tracking filter. Receiver system 200 is identical to receiver system 100 except between LNA 104 and mixer 106 is RF tracking filter 202. Ideally, the RF tracking filter would permit only signals in desired channel to pass. While the LO harmonics still exist and reside at the same levels as in system 100. RF tracking filter 202 attenuates the input RF signal at the corresponding LO harmonic frequencies thereby reducing or eliminating undesired baseband signals downconverted from the LO harmonics.

One of the major reasons for the high linearity requirements is because non-linearity in a receiver leads to inadvertent frequency mixing, that is signals residing in different channels can get mixed together some of which can result in interference in the desired channel. As a result, since an RF tracking filter attenuates undesired channels over the enter frequency band. Thus, by implementing an RF tracking filter, the linearity requirements of the subsequent receiver stages can be relaxed. In particular, the amplifier stages can be implemented with much lower IP3 specifications reducing the total power dissipation of the receiver. More specifically, a silicon terrestrial tuner with an RF tracking filter can achieve much improved composite tripe beat (CTB) and composite second-order beat (CSO) performances and henceforth can obtain a large signal to noise plus distortion ratio (SNDR) at its output.

The benefits of the RF tracking filter is tempered by the challenges introduced by implementing the RF tracking filter in silicon. Chief among the challenges are minimizing the chip area and the power consumption, in particular the amount of current required. To effectively reduce the current consumption of TV receivers, the RF tracking filter should be fully integrated into the RF front-end (RF front-end in general stands for a receiver front-end section which includes all blocks before the first frequency conversion) of a tuner because: discrete RF tracking filters exhibit insertion loss so it requires more gain of the low noise amplifier and this will result in more current consumption of the low noise amplifier;

Further it also requires both an input buffer and an output buffer to interface with the discrete RF tracking filter but both buffers consume currents for linearity. Ideally, the RF tracking filter should have a very wide dynamic range with a low noise figure, high IP3 and a minimum amount of voltage gain required to maintain the overall sensitivity limited by the noise figure of the subsequent amplification stages. Specifically, a low noise figure is desired because, a tracking filter is located at the RF front-end before the RF mixer. Furthermore, a high IP3 is needed because the received RF signals are amplified by a low noise amplifier located before a RF tracking filter. A gain produced by the tracking filter will make the noises of the following circuit blocks contribute less to the overall tuner noise figure because their contribution to the overall noise figure are divided by the accumulated gain including the gain from the tracking filter. For wide band applications, the tracking filter should also be tunable over a very wide band, for example from 50 MHz to 850 MHz as given in an example above. The gain should remain flat over the entire tuning range with minimal band-pass ripple.

There have been many different topologies implemented in the past as RF Tracking Filters for various receiver designs. While suitable for some applications, these different topologies have significant drawbacks making them unsuitable for or at a minimum difficult to use in wide band receiver applications.

One topology used in the past is a discrete, passive LC ladder tracking filter as taught in U.S. Pat. No. 6,453,157. The architecture is a basic ladder circuit comprising inductors and capacitors (hence LC). While this topology provides attenuation up to 50 dB, it suffers from a discrete implementation comprising components to bulky to be efficiently integrated into a silicon tuner. In the embodiments taught by U.S. Pat. No. 6,453,157, six 33 nH inductors are used which would occupy an extremely large amount of area on a silicon chip. Additionally, there is a loss of approximately 5 dB by using a purely passive component. A loss introduced by the tracking filter results in a higher noise contribution from the following blocks of a receiver and therefore makes the overall noise figure of the tuner higher. Finally, the topology has a relatively narrow tuning rage of 400-470 MHz falling well short of the require range for terrestrial and cable TV applications.

Another tracking filter topology is the transformer-based, Q-enhanced band-pass filter. A Q-enhanced band-pass filter is built from a series-C coupled sequence of resonators. FIG. 3A shows a basic series-C coupled resonator band-pass filter. A plurality of resonators 302 are coupled through a plurality of capacitors 304 connected in series. In the most basic form the resonators are simple LC resonators as shown in FIG. 3B comprising inductor 310 and capacitor 312.

The Q-enhanced band-pass filter improves upon the basic series-C coupled resonator band-pass filter, by using the resonator shown in FIG. 3C. The addition of transistors 320 and 322 enables the filter to introduce gain to compensate for any loss in the circuit and the ability to tune the frequency. The gain allows for a flatter band pass response.

While this design resolves some of the deficiencies of previous designs, it still suffers from several weaknesses that make it impractical for integrate silicon broad band applications. As an example, Gee, et al. ("CMOS Integrated LC RF Bandpass Filter with Transformer-Coupled Q-Enhancement and Optimized Linearity" Gee, W. A; Allen, P. E. *Proceedings of IEEE International Symposium on Circuits and Systems* 2007, P. 1445-1448) shows that the dynamic range is limited which results in a high noise figure and a low IP3, insufficient for wide band receiver applications. In addition this design does not provide adequate tuning range for the wide band receiver applications. Further, the presence of inductors in the form of transformers is too costly in terms of chip area.

Another design for a tracking filter is the integrated tunable Gm-C bi-quad filter as disclosed in U.S. Pat. No. 6,915,121 which overcomes the drawbacks of the previous filter designs by eliminating the need of on chip inductors. However, the disclosure does not discuss any specific dynamic range performance or tuning bandwidth coverage for comparison with other topologies.

A fourth tracking filter topology employs the use of Micro Electro-Mechanical Systems (MEMS) structures. An embodiment described by K. Entesari, et al. ("A 12-18 GHz Three-Pole RF MEMS Tunable Filter" K. Entesari, G. Rebeiz, IEEE Transactions on Microwave Theory and Techniques, Vol. 53. No. 8, August 2005) claims a very wide 40% tuning bandwidth from 12 to 18 GHz with good attenuation as high as 50 dB for adjacent channels and very high input referred IP3 (IIP3)≧+37 dBm. However, there are several drawbacks that prohibit use of the RF MEMs filters for cable, terrestrial, and satellite TV bands. The first limitation is the center frequencies of the bands, which are much higher than the desired 50 to 850 MHz for TV applications. Secondly, the filter requires an extremely large chip area of 32 mm$^2$, which is nearly twice the size of most RF Silicon tuner chips used for these applications and would nearly triple the wafer costs. Also, the filter requires very expensive wafer post processing steps beyond conventional SiGe BiCMOS or CMOS technologies to add the MEMS filter structures. Lastly, the filter is passive and therefore not capable of providing any gain to limit the noise figure contribution of the back end receiver, making it impractical to be integrated into the RF front end of the tuner. Accordingly, various needs exist in the industry to address the aforementioned deficiencies and inadequacies.

SUMMARY OF INVENTION

Systems and methods for an RF tracking filter covering a broad frequency band are disclosed. One embodiment of the RF tracking filter comprises a plurality of tunable amplifiers, each operating over a specific frequency band within the broad frequency band and decoder logic which can be used to specify which frequency the tracking filter is selected to operate at. Each tunable amplifer comprises a tunable tank impedance, a plurality of voltage to current converters (V2I) and an output buffer amplifier. The tunable tank impedance can be used to select the center frequency of the tunable amplifier. The plurality of V2I can be used to maintain uniform gain regardless of the center frequency. Additional logic can be used to specify a subband within the specific frequency band for which the tunable amplifier operates. The tunable tank impedance can comprise an inductor or a high Q MEMs resonator and a variable capacitor, which can be a programmable capacitor array, a plurality of MOS varactors or a plurality of PN varactors. The inductor can be configured as a center-tap differential inductor. The inductor can also be an off-chip high Q inductor, an on-chip spiral inductor, a high Q bond-wire inductor. The tunable tank impedance can further comprise a resistor which can be used to maintain a uniform Q regardless of the center frequency.

Also disclosed is a method of filter an RF signal comprising receiving a frequency band selection input and activating one of a set of tunable amplifiers based on the desired center frequency and using that activated tunable amplifier to filter the RF signal. Each of the tunable amplifiers may further adjust a tunable tank impedance based on sub band information specified in the frequency and selection as well as selecting at least one of the V2I. Furthermore, the tunable amplifiers may further use a resistor to maintain a uniform Q regardless of the center frequency selected.

The RF filter and methods described above can be used in TV set-up boxes or digital TVs for terrestrial/cable and satellite broadcasts. It can be in general applied to any other broad band communication systems such as ultra wide band (UWB) and wireless high-definition television (wireless HD).

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
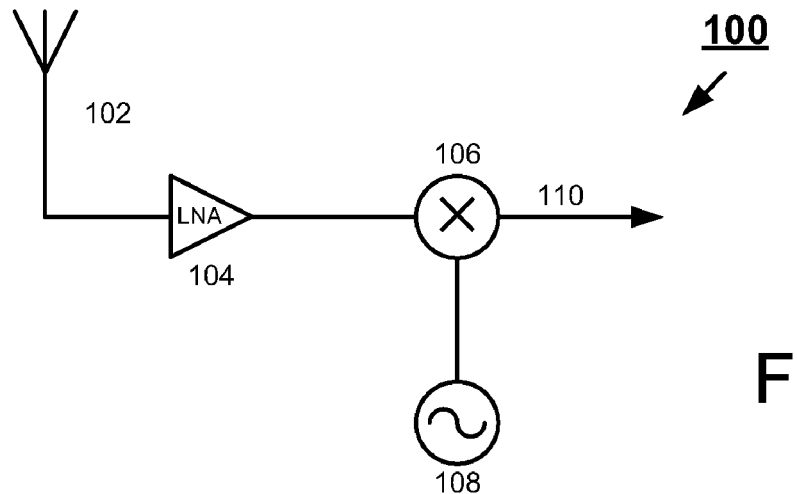
FIG. 1 shows a basic direct conversion receiver.
Figure 2:
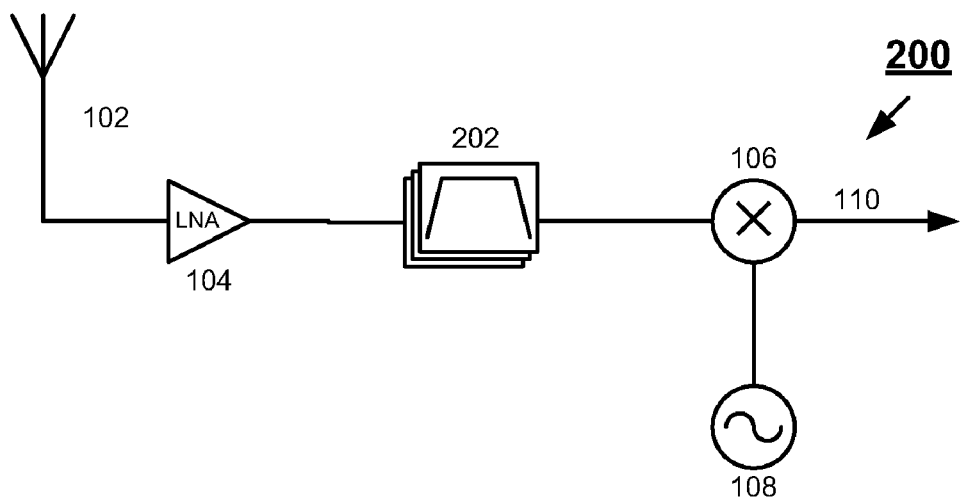
FIG. 2 shows a direct conversion receiver with an RF tracking filter.
Figure 3A:
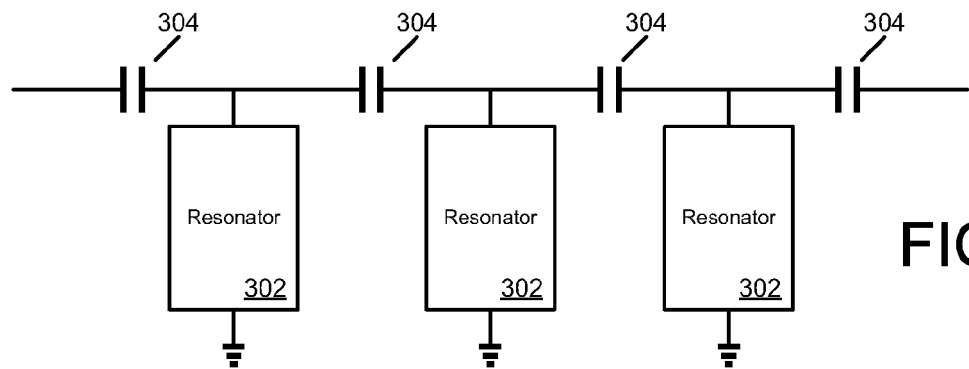
FIG. 3A shows a basic series-C coupled resonator band-pass filter.
Figure 3B:
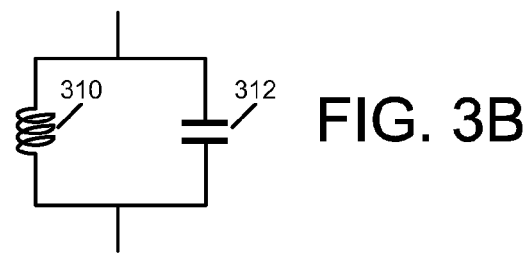
FIG. 3B shows resonators of FIG. 3A as simple LC resonators.
Figure 3C:
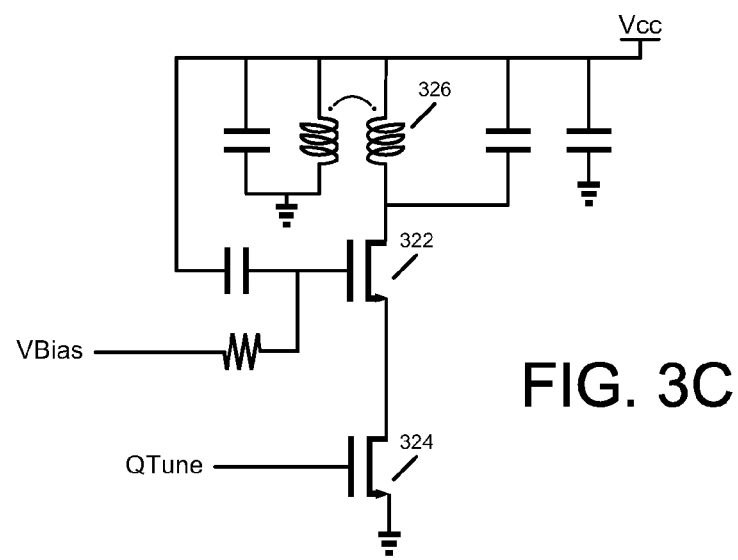
FIG. 3C shows resonators of FIG. 3A in implementing a Q-enhanced band-pass filter.
Figure 4:
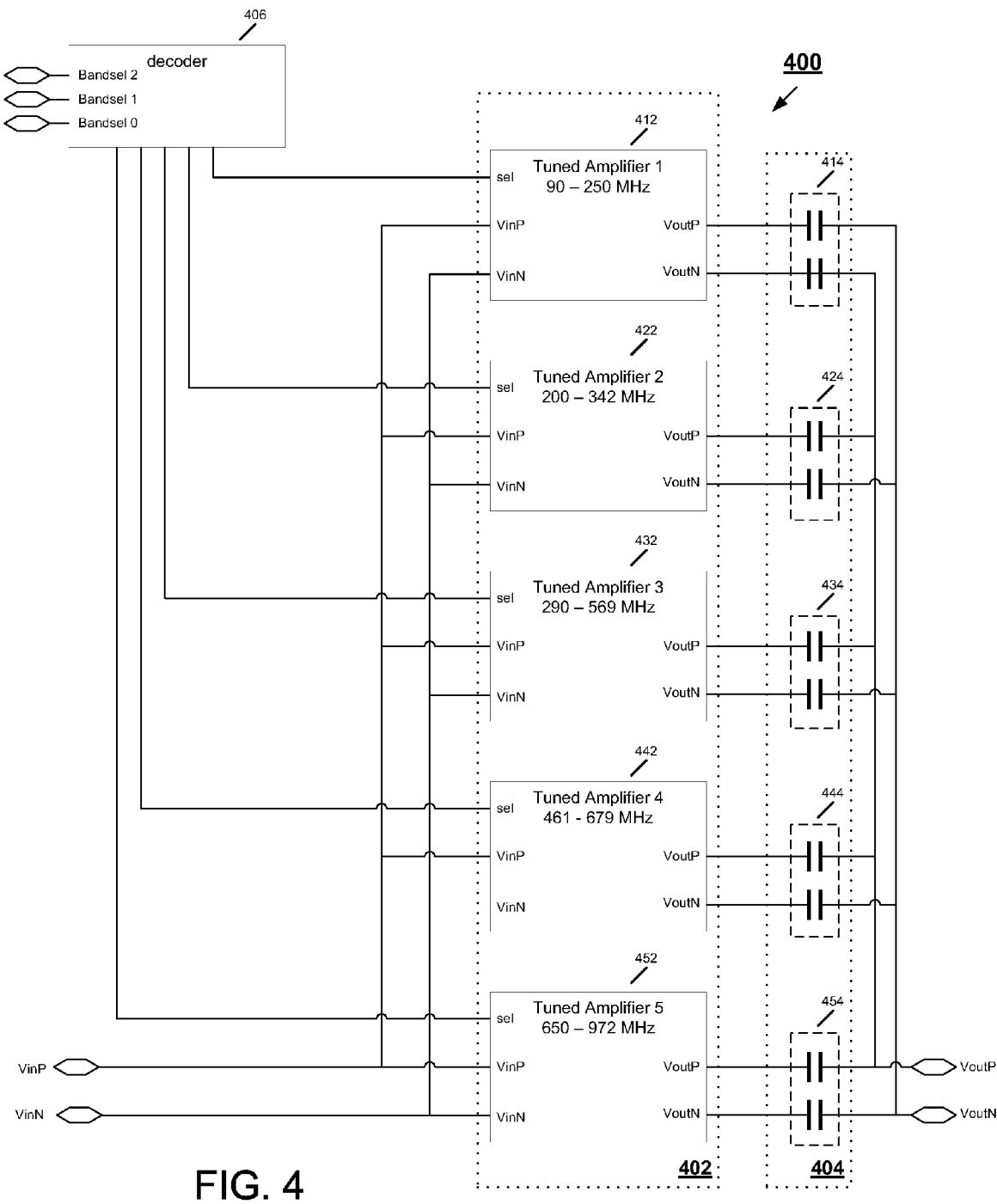
FIG. 4 illustrates an embodiment of an RF tracking filter for broad band applications.

Embodiments of the present invention resolve many of the difficulties in implementing an RF tracking filter in an integrated broad band application. FIG. 4 illustrates an embodiment of an RF tracking filter for broad band applications. Filter 400 comprises a plurality of parallel tuned amplifiers 402. The plurality of parallel tuned amplifiers 402 are coupled to a common differential output through a plurality of pairs of coupling capacitors 404. More specifically, a differential input signal is supplied to each of the tuned amplifiers and coupled to a common differential output through a pair of coupling capacitor for each amplifier. For example, tuned amplifier 432 is coupled to the differential output through coupling capacitors 434. Each of the tuned amplifiers is designed to cover a different band within the overall frequency range. In order to account for the presents of mismatch and process-voltage-temperature (PVT) center frequency shift, the bands should overlap with their adjacent bands. While typically for high frequency applications differential voltage signals are used, it should be understood that a ground reference voltage, current or differential current signals could also be employed.

Though in the specific example shown in FIG. 4, the plurality 402 comprises five tuned amplifiers 412, 422, 432, 442, and 452, it should be understood that any number of tuned amplifiers can be used. The tuned amplifiers divide the full frequency band of 90 MHz to 860 MHz into five bands. Each tuned amplifier is responsible for one of these bands. Specifically, tuned amplifier 412 covers 90-250 MHz, tuned amplifier 422 covers 200-342 MHz, tuned amplifier 432 covers 290-569 MHz, tuned amplifier 442 covers 461-679 MHz; and tuned amplifier 452 covers 650-972 MHz. As described above, each band overlaps adjacent bands. Each of the tuned amplifiers has a selectable input received from decoder logic 406. In the exemplar shown in FIG. 4, the inputs represent three band select bits, so if the band select bits represent the binary representation for tuned amplifier 432, the "sel" signal for tuned amplifier 432 is set and the "sel" signal for the remaining amplifiers is cleared. In this way, For the desired frequency, the appropriate tuner is activated.

Decoder logic 406 performs basic logic and can be implemented in a number of standard ways. For example, decoder logic 406 can comprise basic digital logic components and/or other types of hardware. In alternate implementations, it could comprise a combination of hardware and firmware/software. Techniques and implementations of which are apparent to those of ordinary skill in the art.

Figure 5:
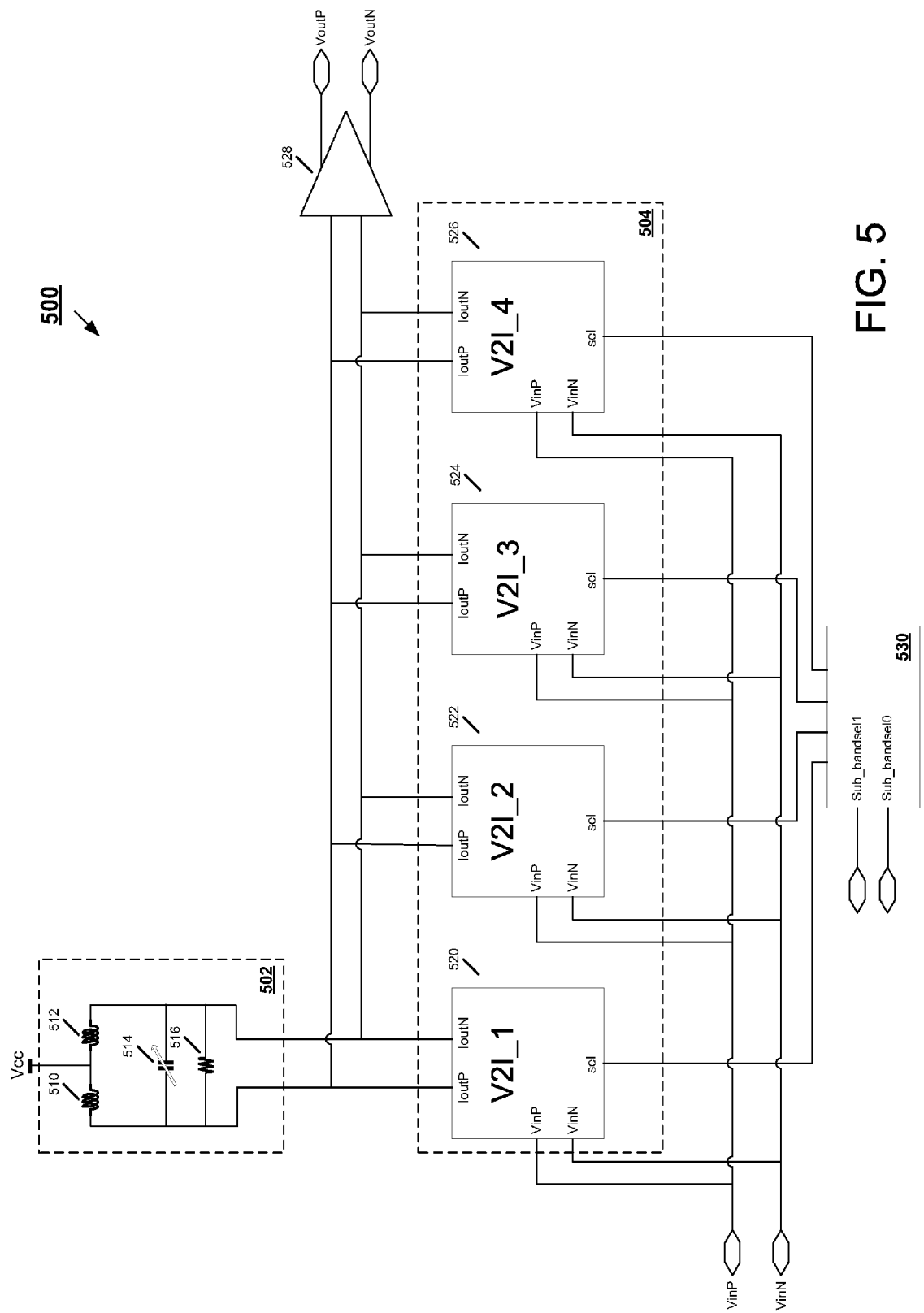
FIG. 5 shows an embodiment of an individual tuned amplifier.

FIG. 5 shows an embodiment of an individual tuned amplifier. In this example of a tuned amplifier, a resonant amplifier is used. Amplifier 500 could represent the implementation of any one of the plurality of tuned amplifiers 402. However, though the architecture of each of tuned amplifiers is similar, the specific values ascribed to each component would vary between them. For instance, in an implementation of tuned amplifier 412, higher inductances would be used in inductors 510 and 512 than in an implementation of tuned amplifier 452.

Specifically, tuned amplifier 500 comprises programmable tuned LC tank impedance 502, plurality 504 of parallel voltage to current (V2I) converters, decoder 530 and output buffer amplifier 528. While in this example, plurality 504 comprises four V2I converters any number of V2I converters can be employed. LC tank impedance 502 comprises one or more inductors (shown as inductors 510 and 512) and a variable capacitor 514. The variability of the capacitor enables the ability to adjust the resonant frequency of the tank impedance thereby allowing the selection of the center frequency of the tuned amplifier. Since the impedance of the tank varies with frequency and the capacitance of variable capacitor 514, the gain can vary over the range of frequencies. The gain can be adjusted by changing the amount of current driving the tank impedance.

Plurality 504 of V2I converters serve as a variable current source. In the example depicted in FIG. 5, the proportion of current to voltage, known in the art as transconductance can be different for each of the plurality of V2I converters. Each of the V2I converters can be turned on or off using a select input. Decoder 530 directs which V2I converters are active depending on the frequency the tuner is configured to pass. Decoder 530 can be a separate decoder within tuned amplifier 500 or in another configuration can reside outside of tuned amplifier 500 and reside as part of decoder 406 as part of RF tracking filter 400. Decoder 530 can be implemented using digital logic components and/or other hardware or alternatively a similar implementation to that of decoder logic 406 described above. In the specific example in FIG. 5, four sub-bands are depicted each having a different V2I converters to maintain a constant gain across all four sub-bands. For each sub-band, each only one V2I is active. In another configuration, the skilled artisan will recognize multiple V2I converters could be active for a broader combination of currents. In this way, the gain of the tracking filter for each of the sub-bands remains flat with varying frequency. The flat response of all the different sub-bands is critical for tracking filter performance over a wide band.

It is also important that for each tuned amplifier in the plurality of tuned amplifiers be optimized for the maximum loaded Q in the given IC process technology. While maintaining the bandwidth, the Q will decrease as the center frequency of the amplifier decreases. It is therefore desirable to design the LC tank with the highest loaded Q. Therefore, when the amplifier is tuned to the lowest center frequency it still can maintain a high Q. As described below, a de-Q resistor can be added to maintain a more uniform Q over the entire tunable frequency range. As the impedance of an LC tank due to the capacitor and inductors would differ among the various tuned amplifiers, de-Q resistor 516 is added to the LC resonant tank. This forces the load impedance of each tuned amplifier to constant value, independent of frequency. In this way, the gain of the tracking filter for each band can be held constant and set to match each of the other bands covering different frequencies. Thereby, the tracking filter maintains a flat gain over a very wide frequency tuning bandwidth. De-Q resistor 516 also increases the 3 dB bandwidth of the higher frequency bands. In that way, the programmable tuning network can be tuned over a wider bandwidth without resulting in severe gain dips between bands at the higher frequencies where the loaded Q of the LC tank resonator is higher.

Figure 6:
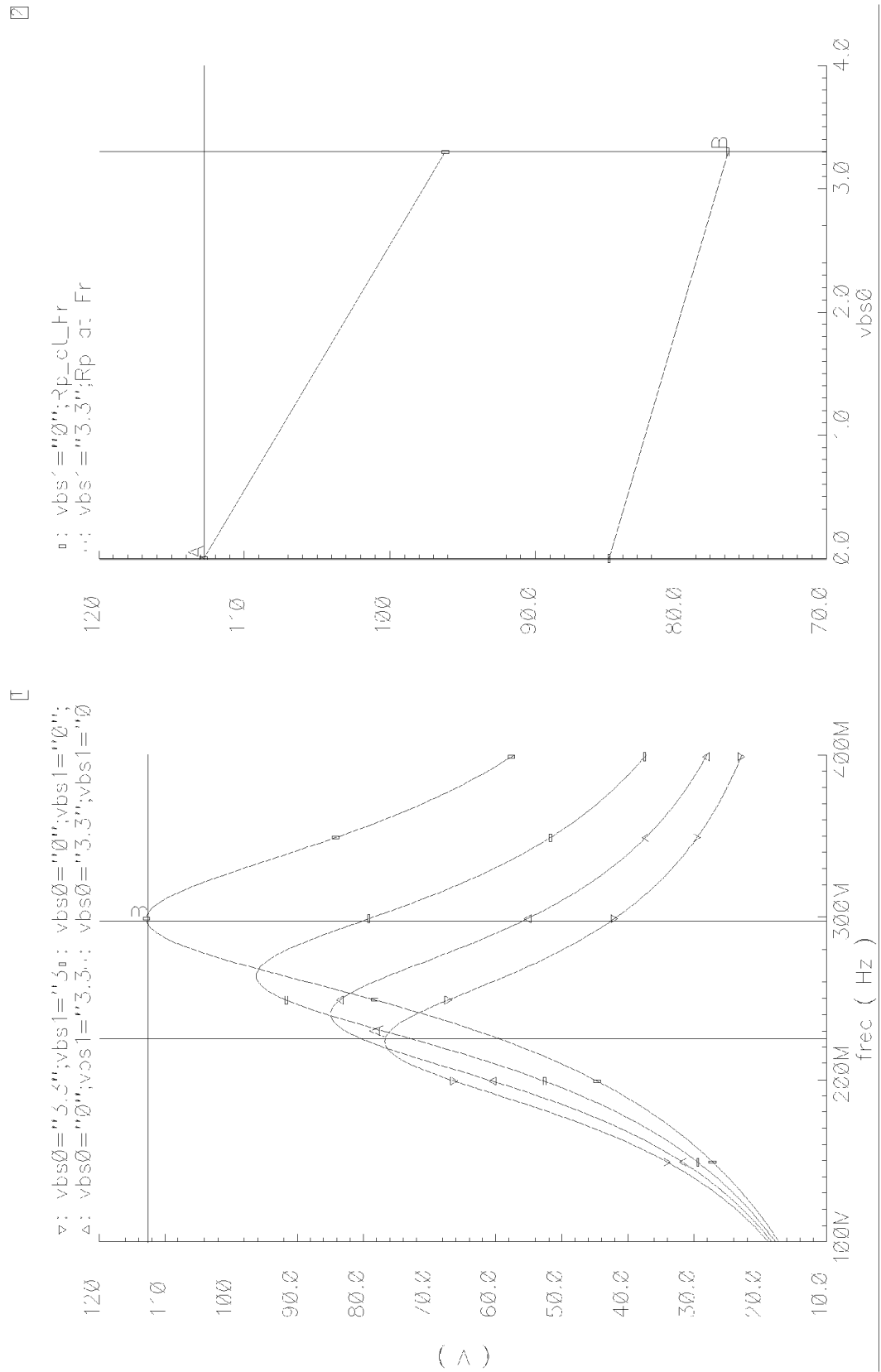
FIG. 6 shows an example of an LC tank with impedance that increases with frequency of the sub-band.

An example of an LC tank with impedance that increases with frequency of the sub-band is shown in FIG. 6. The figure shows that the equivalent parallel load resistance of the tank, $R_p$, varies by more than 40% from 76Ω to 112Ω. This represents a gain rollup of over 3 dB and requires gain compensation to achieve flat gain over the full tuning range of the tuned amplifier sub-band. Buffer amplifier 528 isolates tank impedance 502 from the load and all of the other tanks belonging to the other parallel tuned amplifiers. It also serves as an analog multiplexer (MUX) by selectively passing the signal though the correct tuned amplifier which has a center frequency that matches the input channel frequency. The programmable tank impedance can be implemented with several different resonator networks that are most appropriate for the given frequency band coverage of the particular tuned amplifier stage. These resonant networks include a parallel LC tank with on-chip spiral inductor and programmable capacitor array; a parallel LC tank with off-chip high Q inductors and an on-chip programmable capacitor array; a parallel LC tank with high Q bond-wire inductors and an on-chip programmable capacitor array; and an RF MEMS resonant tank with high Q MEMs resonator and on-chip programmable capacitor array.

Figure 7:
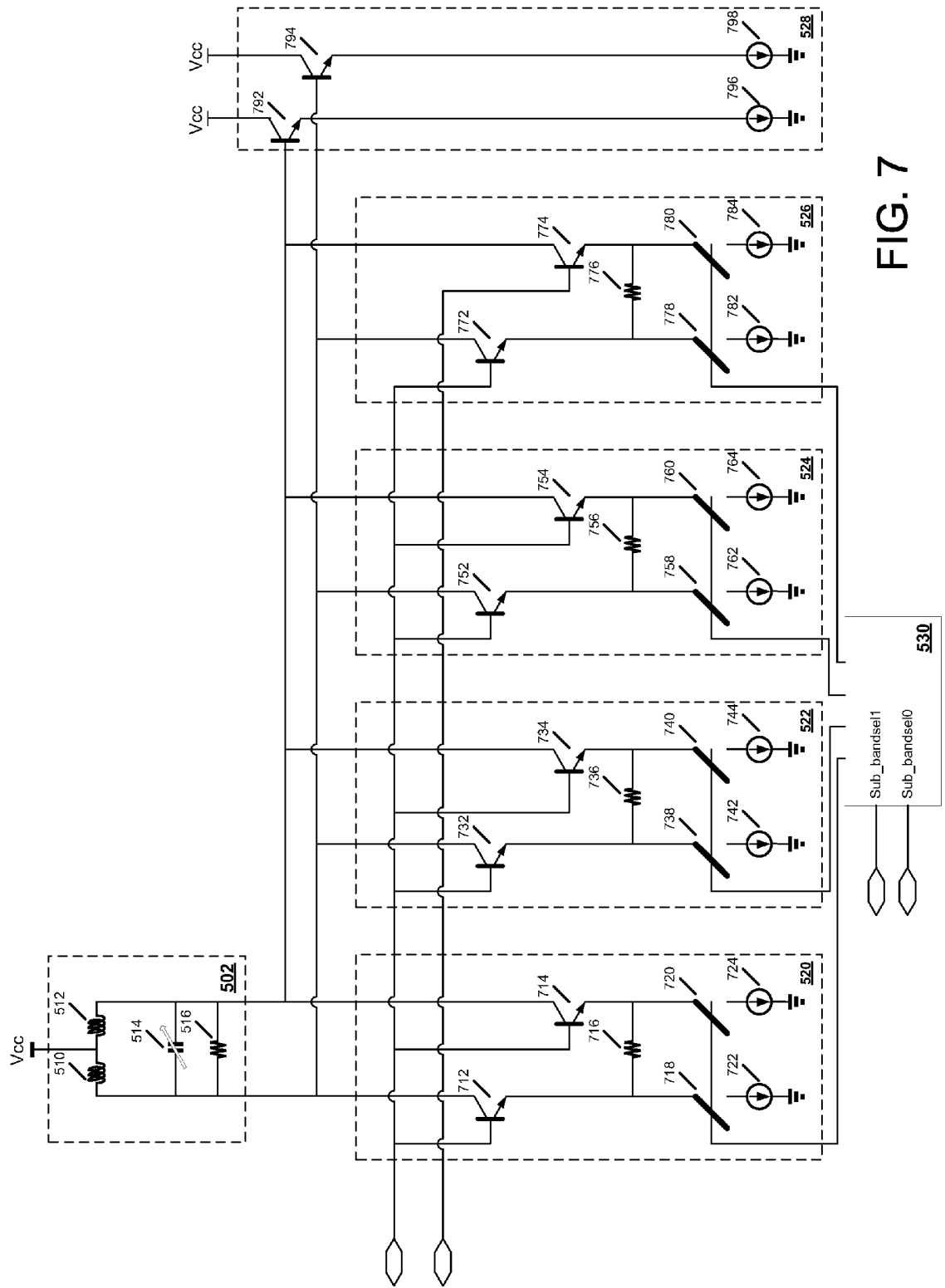
FIG. 7 shows a particular implementation of the tuned amplifier shown above.

FIG. 7 shows a particular implementation of the tuned amplifier shown above. Plurality 502 of V2I converters comprises V2I converters 520, 522, 524 and 526. The architecture of the each V2I converter is similar; however, the specification of each component may differ. As an example of the implementation of a V2I converter, V2I converter 520 is described. It comprises transistors 712 and 714, current sources 722 and 724, resistor 716 and switches 718 and 720. When V2I converter 520 has "sel" signal set, switches 718 and 720 are closed allowing current sources 722 and 724 to drive the circuit. However, if the "sel" signal is clear, both switches 718 and 720 are open disconnecting current sources 722 and 724 thereby deactivating V2I converter 520. V2I converter 520 is a degenerated NPN differential pair. In this example, V2I converters 520, 522, 524 and 526 are identical except for resistors 716, 736, 756 and 776 which have different values. The value of each resistor sets the trans-conductance of the corresponding V2I converter, e.g., resistor 756 sets the trans-conductance of V2I 524. LC tank 502 is the same as FIG. 5. Inductors 510 and 512 and variable capacitor 514 are optimized for the very highest Q achievable for the desired center frequency tuning range. In particular because inductors, for example, are affected by a number of factors in their physical implementation (e.g., shape, number of turns, space between turns, width of the metal, substrate shielding, metal thickness, etc.), they can be designed with different objectives, such as achieving the highest Q for the desired center frequency tuning range. Either or both inductors 510 and 512 can be implemented either with a differential on-chip spiral inductor or 2 off-chip high Q RF inductors. Inductors 510 and 512 can function a differential center-tap inductor when the inductances associated with inductors 510 and 512 are essentially the same. The choice may rely on the inductance required. For example, for a lower frequency tuned amplifier where a larger inductor is required and off-chip implementation may be more practical.

Finally, tuner amplifier 500 also comprises buffer amplifier 528. Buffer amplifier 528 in the exemplary implementation comprises two transistors 792 and 794 coupled to two current sources 796 and 798. Both transistors 792 and 794 are configured in an NPN emitter-follower circuit Emitter follower circuits are known to offer very high linearity with lowest current.

Figure 8:
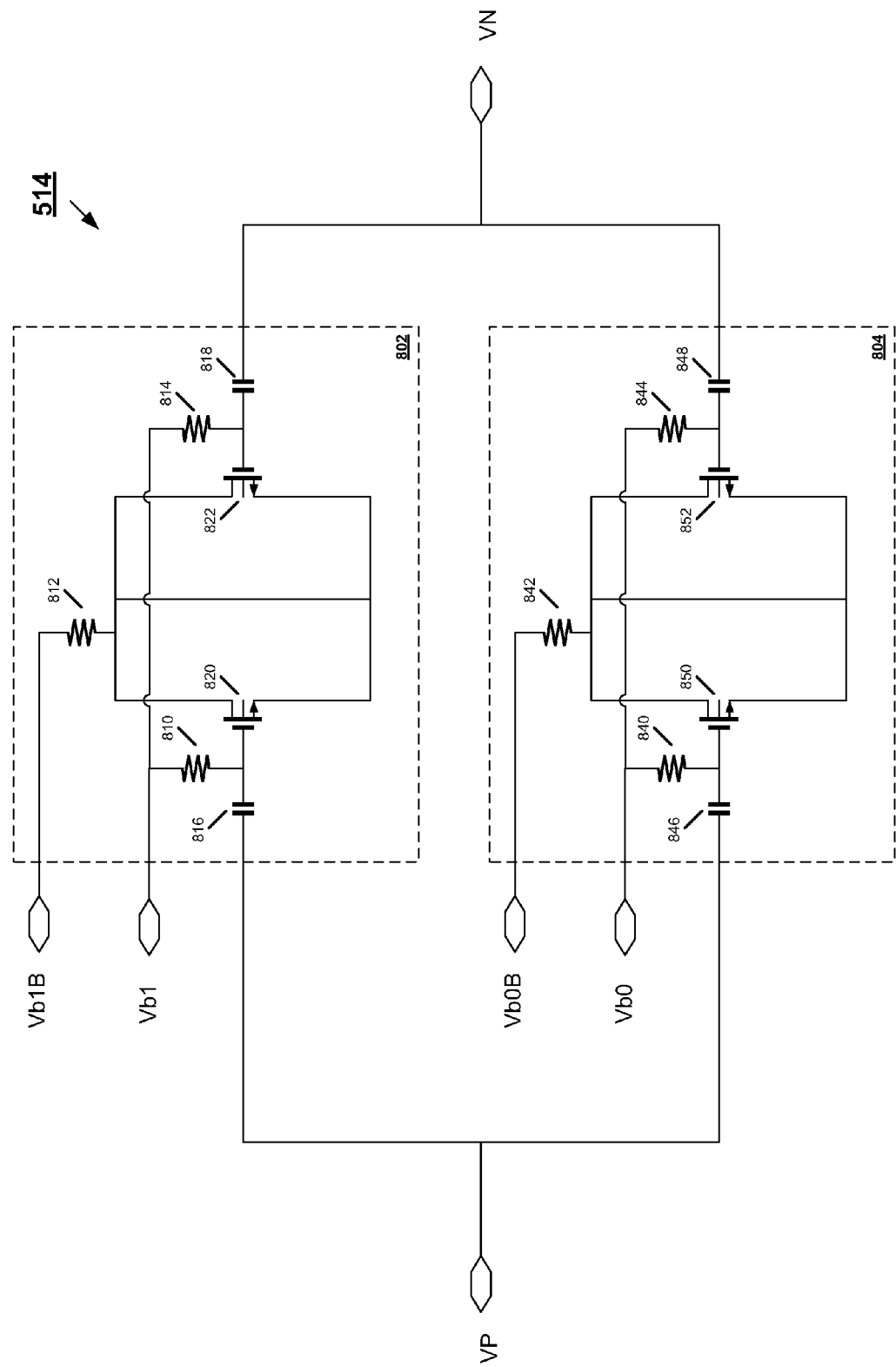
FIG. 8 shows an implementation of a programmable variable capacitor.

FIG. 8 shows an implementation of a programmable variable capacitor. Specifically, variable capacitor 514 is a programmable capacitor tuning array. Variable capacitor 514 comprises one or more high Q MOS varactor circuits. The 2-bit array shown is optimum for tuning because it offers coverage of the widest tuning range with a single LC resonator without creating gain dip issues in between bands as the Q increases with frequency. However, one of ordinary skill in the art would recognize that in general a n-bit array of high Q MOS varactor circuits could be used. Varactor circuit 802 comprises MOSFETs 820 and 822 configured as varactors, a diode with variable capacitance. Resistors 810, 812, and 814 are bias resistors in varactor circuit 802. Capacitors 816 and 818 coupled varactor 820 and 822 to LC tank 502 shown in FIGS. 5 and 7. The capacitors serve to isolate the DC bias voltages. Varactor 804 is similar to varactor 802 except they are designed to each cover a different capacitance range. Individually or together the varactors are designed to span the capacitances required to support the target frequency sub bands specified by the particular tunable amplifier. Multiple varactors are typically used since a single varactor having a large capacitance range would produce ripples within the varactors tuned range. Hence, it may be preferable to utilize more than one varactor having a smaller tuned range but with an acceptable ripple.

The use of MOS varactor circuits offers an implementation for the programmable variable capacitor with the lowest equivalent series resistance (ESR) hence the highest Q, as well as the minimum parasitic capacitance.

An alternative implementation of a programmable variable capacitor is to use PN junction varactors in place of the MOSFETs 820 and 822. Specific implementations can be found in Gutiérrez, et al. (pp. 11-30) (I. Gutiérrez, J. Melén- dez, E. Hernández, *Design and Characterization of Integrated Varactors for RF Applications,* John Wiley & Sons, New York, 2006) which is hereby incorporated by reference.

Figure 9:
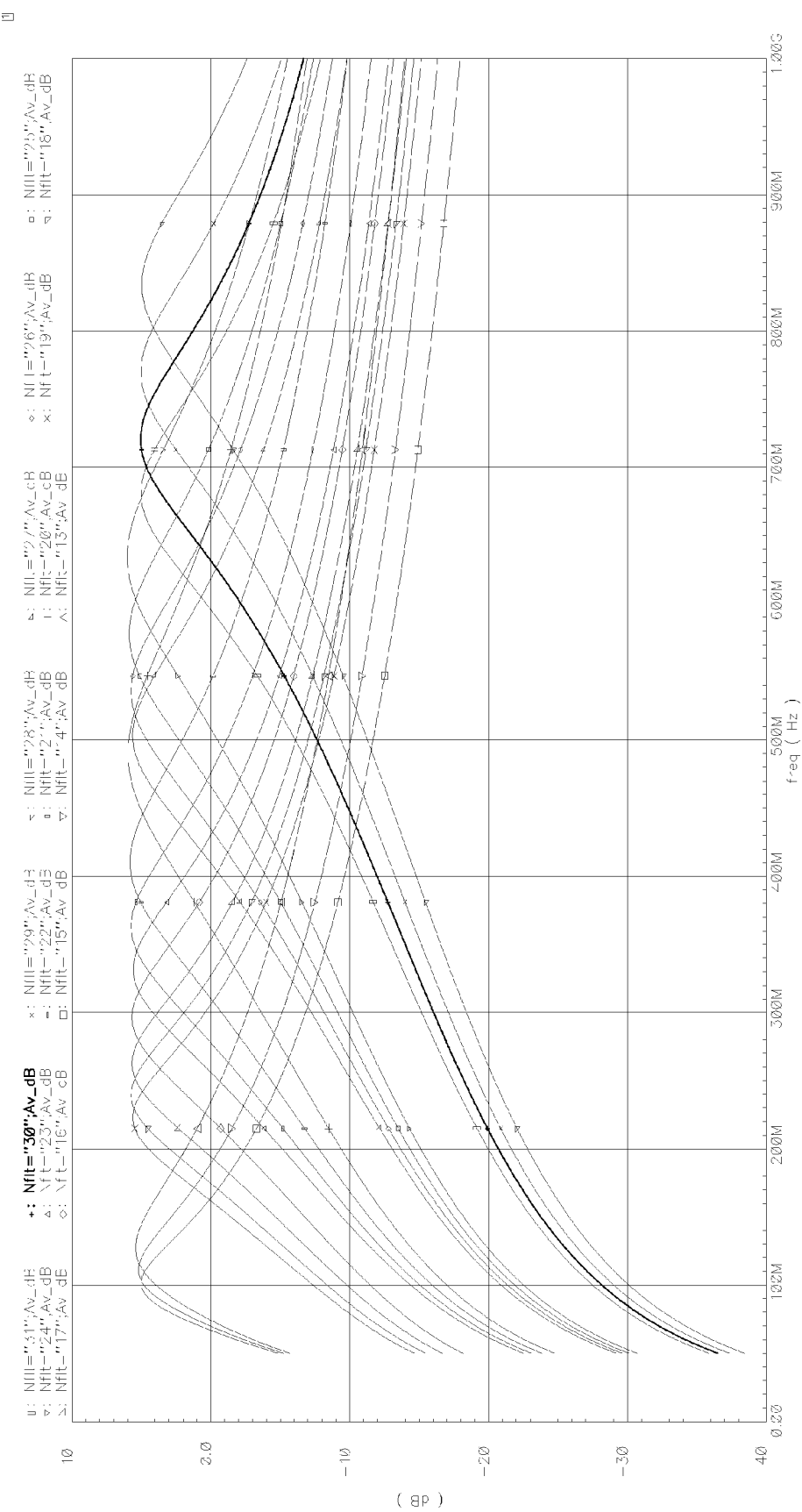
FIG. 9 shows graphically the gain of an embodiment of the RF tracking filter with 20 sub-bands under circuit simulation.

FIG. 9 shows graphically the gain of an embodiment of the RF tracking filter with 20 sub-bands under circuit simulation. The results were simulated using Spectre by Cadence. Specifically, the RF tracking filter simulated has 5 tuned amplifiers each with 4 sub-bands making a total of 20 sub-bands. The simulation results demonstrates frequency response of all 20 tracking filter frequency bands to cover 90 MHz to 860 MHz by sweeping the band selector decoder. As shown, the RF tracking filter covers a 1-dB band-width ranging from 90 MHz to 860 MHz with in-band, and band to band ripple ≦1 dB.

Figure 10:
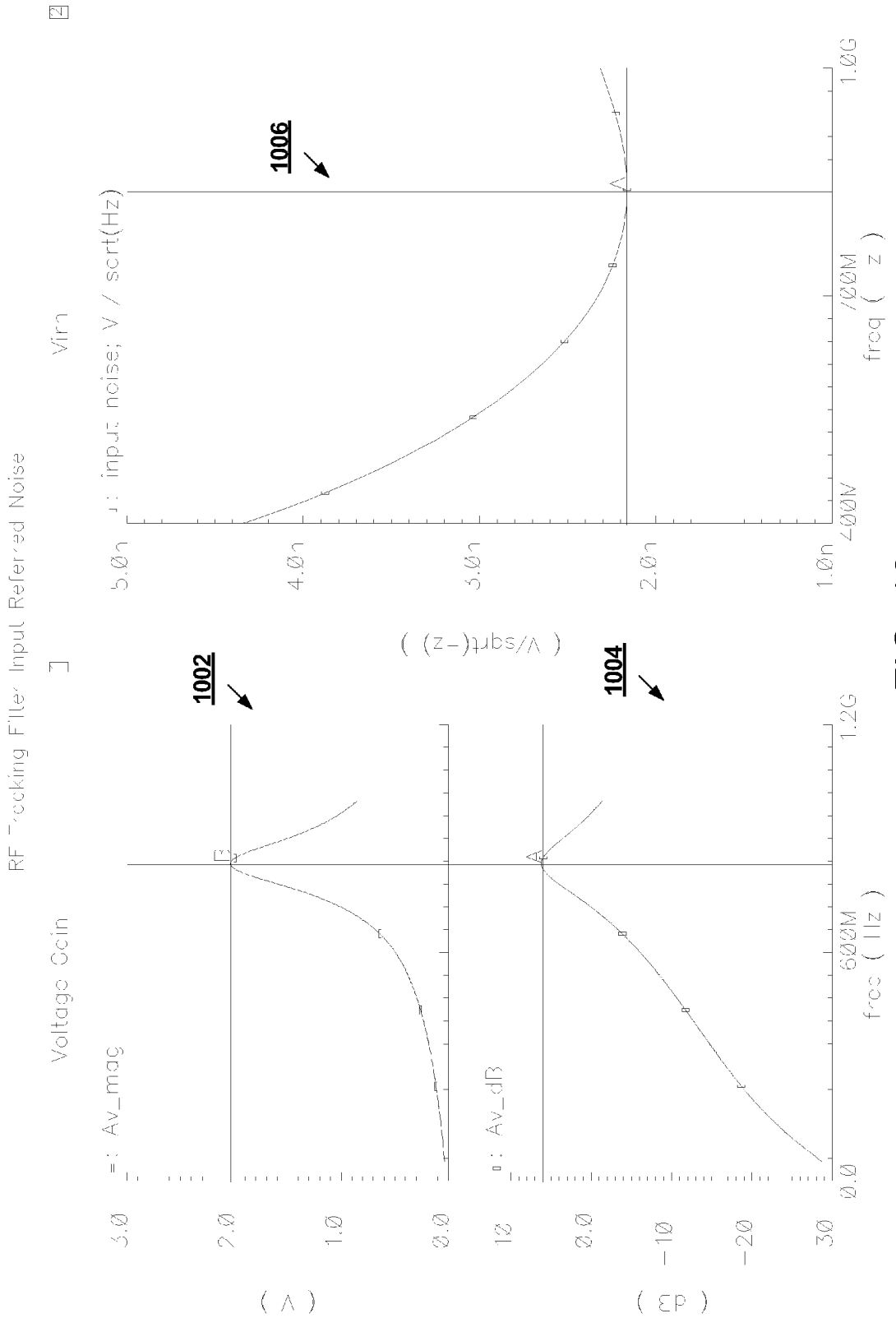
FIG. 10 shows the input referred noise of an embodiment of the RF tracking filter.

FIG. 10 shows the input referred noise of an embodiment of the RF tracking filter. Again, the results were simulated using Spectre. The results show the RF tracking filter centered at 835 MHz. The gain across a wide frequency range is shown in graph 1002 in terms of magnitude and in graph 1004 in terms of dB. The achieved input referred noise into a source resistor $R_s$=200Ω, is 2.2 nV/√Hz (NF≈3.9 dB), which is low enough noise for negligible overall noise figure when used in an RF Front End.

Figure 11:
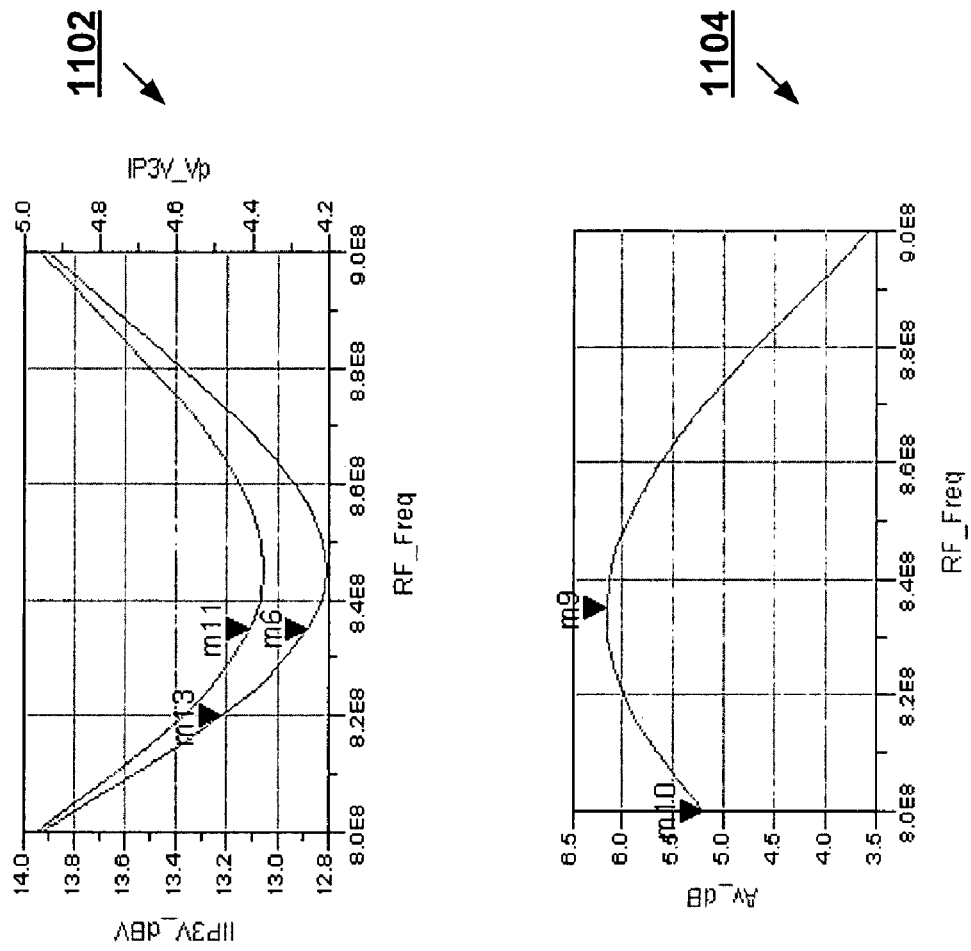
FIG. 11 shows the IIP3 relative to peak voltage (IIP3V) of an embodiment of the RF tracking filter.

FIG. 11 shows the IIP3 of an embodiment of the RF tracking filter. The results were simulated using Advanced Design System by Agilent. The results show the RF tracking filter centered at 835 MHz. Graph 1104 shows the graph of gain in dB plotted against the frequency. Graph 1102 shows the graph of the IIP3V in terms of dB relative to voltage (dBV) in the lower curve. Graph 1102 also shows a graph of the IIP3V in terms of magnitude in units of peak voltage ($V_p$) in the lower curve. At the center frequency 835 MHz, the IIP3 is about 4.4 $V_p$ or ~12.88 dBV. The input referred third order intercept point is determined into a source resistor $R_s$=200Ω.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. An radio frequency (RF) tracking filter comprising:
   a plurality of tunable amplifiers; and
   decoder logic configured to receive frequency band selection input and to activate one of the plurality of tunable amplifiers based on the frequency band selection input, wherein the RF tracking filter maintains a flat gain over a frequency tuning bandwidth, wherein a load impedance of each of the tunable amplifiers is set to a constant value, and wherein the constant value is independent of frequencies of the tunable amplifiers.

2. The RF tracking filter of claim 1, wherein each of the plurality of tunable amplifiers comprises:
   a tunable tank impedance;
   a plurality of voltage to current (V2I) converters; and
   an output buffer amplifier; wherein at least one of the plurality of V2I converters draws a current through the tunable tank impedance to provide gain to an input signal provided to an output signal coupled to the output buffer amplifier.

3. The RF tracking filter of claim 2, wherein each of the frequency band selection input comprises subband information and the subband information tunes the tunable tank impedance and selects and activates at least one of the plurality of V2I converters.

4. The RF tracking filter of claim 3, wherein each of the plurality of tunable amplifiers comprises subband decoder logic wherein the subband decoder logic receives the frequency band selection input, extracts the subband information and activates at least one of the plurality of V2I converters.

5. The RF tracking filter of claim 3, wherein the subband information is received from the decoder logic.

6. The RF tracking filter of claim 3, wherein each of the plurality of tunable amplifiers further comprises a decoder and the subband information is provided by the decoder.

7. The RF tracking filter of claim 2, wherein the tunable tank impedance comprises:
   a variable capacitor; and
   a first inductor coupled in parallel with the variable capacitor.

8. The RF tracking filter of claim 7, wherein the first inductor is an off-chip inductor.

9. The RF tracking filter of claim 7, wherein the first inductor is an on-chip spiral inductor.

10. The RF tracking filter of claim 7, wherein the first inductor is a bond-wire inductor.

11. The RF tracking filter of claim 2, wherein the tunable tank impedance comprises:
    an RF MEMS resonant tank with high Q MEMs resonator and a variable capacitor.

12. The RF tracking filter of claim 7, wherein the tunable tank impedance further comprises a de-Q resistor coupled in parallel with the variable capacitor to maintain a constant gain.

13. The RF tracking filter of claim 7, wherein the tunable tank impedance further comprises a center-tap differential inductor coupled in parallel with the variable capacitor.

14. The RF tracking filter of claim 7, wherein the variable capacitor comprises a programmable capacitor array.

15. The RF tracking filter of claim 7, wherein the variable capacitor comprises at least one MOS varactor.

16. The RF tracking filter of claim 7, wherein the variable capacitor comprises at least one PN junction varactor.

17. The RF tracking filter of claim 7, wherein the variable capacitor comprises a programmable capacitor array and at least one varactor.

18. A television set-top box comprising an RF receiver comprising the RF tracking filter of claim 1.

19. A digital television comprising an RF receiver comprising the RF tracking filter of claim 1.

20. A broad band communications system comprising an RF receiver comprising the RF tracking filter of claim 1.

21. A method of filtering an RF signal using an RF tracking filter comprising:
    receiving a frequency band selection input;
    activating one of a plurality of tunable amplifiers based on the frequency band selection input; and
    using the one of plurality of tunable amplifiers to filter the RF signal such that the RF tracking filter maintains a flat gain over a frequency tuning bandwidth,
    wherein each of the plurality of tunable amplifiers comprises a tunable tank impedance, a plurality of voltage to current (V2I) converters, and an output buffer amplifier, wherein the frequency band selection input comprises subband information wherein the activating one of a plurality of tunable amplifier comprises:
    tuning the tunable tank impedance based on the subband information; and
    activating at least one of the plurality of V2I converters based on the subband information, wherein the tunable tank impedance comprises a variable capacitor and an inductor coupled in parallel with the variable capacitor, wherein the tuning the tunable tank impedance comprises adjusting the variable capacitor, wherein the tunable tank impedance further comprises a de-Q resistor coupled in parallel with the variable capacitor, and wherein the tunable tank impedance further comprises using the de-Q resistor to maintain constant gain.

22. An radio frequency (RF) tracking filter comprising:
a plurality of tunable amplifiers, wherein each of the plurality of tunable amplifiers comprises:
  a tunable tank impedance, wherein the tunable tank impedance comprises:
    a variable capacitor;
    a first inductor coupled in parallel with the variable capacitor; and
    a de-Q resistor coupled in parallel with the variable capacitor such that the RF tracking filter maintains a flat gain over a frequency tuning bandwidth;
  a plurality of voltage to current (V2I) converters; and
  an output buffer amplifier, wherein at least one of the plurality of V2I converters draws a current through the tunable tank impedance to provide gain to an input signal provided to an output signal coupled to the output buffer amplifier; and
decoder logic configured to receive frequency band selection input and to activate one of the plurality of tunable amplifiers based on the frequency band selection input.

* * * * *